United States Patent [19]

Hakata

[11] 4,038,564
[45] July 26, 1977

[54] MULTI-LEVEL VOLTAGE SELECTION CIRCUIT

[75] Inventor: Masayuki Hakata, Oume, Japan

[73] Assignee: Casio Computer Co., Ltd., Tokyo, Japan

[21] Appl. No.: 658,172

[22] Filed: Feb. 17, 1976

[30] Foreign Application Priority Data

Feb. 20, 1975  Japan .................................. 50-21306

[51] Int. Cl.² ...................... H03K 19/08; G02F 1/13; G08B 5/36
[52] U.S. Cl. .................................... 307/205; 307/209; 307/243; 307/270; 307/DIG. 5; 340/324 M; 340/336
[58] Field of Search ............... 307/205, 207, 209, 215, 307/218, 251, 255, 288, 313, DIG. 5, 241–243, 270; 340/336, 324 M

[56] References Cited

U.S. PATENT DOCUMENTS

| | | | |
|---|---|---|---|
| 3,896,430 | 7/1975 | Hatsukano | 340/336 |
| 3,900,742 | 8/1975 | Hampel et al. | 307/205 X |
| 3,903,518 | 9/1975 | Hatsukano | 340/336 |
| 3,936,676 | 2/1976 | Fujita | 307/209 X |
| 3,945,000 | 3/1976 | Suzuki et al. | 307/205 X |

Primary Examiner—John S. Heyman
Assistant Examiner—Larry N. Anagnos
Attorney, Agent, or Firm—Flynn & Frishauf

[57] ABSTRACT

A voltage selection circuit comprises CMOS circuits, each comprised of a series of P-channel MOS transistors and a series of N-channel MOS transistors. In each CMOS circuit, the gate electrodes of the P-channel MOS transistors are connected to those of the N-channel MOS transistors, respectively, to thereby form pairs of P- and N-channel transistors. Binary coded signals are supplied to the gate electrodes of the MOS transistors. In each CMOS circuit, upon receipt of binary coded signals at the pairs of P- and N-channel MOS transistors, only P-channel transistors or only N-channel transistors are turned on one after another. The voltage between the open source electrodes of each CMOS circuit can pass through the P-channel transistors or the N-channel transistors, thereby enabling selection of one of at least four different voltages based on the input binary coded signals.

5 Claims, 3 Drawing Figures

MULTI-LEVEL VOLTAGE SELECTION CIRCUIT

BACKGROUND OF THE INVENTION

This invention relates to a voltage selection circuit adapted to select different levels of voltages.

Recently, liquid display elements have been used in the multidigit display sections of, for example, a desktop type electronic calculator, electronic timepiece etc. where numerals, marks etc. are displayed. Where a multi-digit liquid crystal display element is driven for display, an AC dynamic drive is adopted as a method for extending a service life of the liquid crystal. Since, for example, a one half or one third bias drive system is used as such, it is necessary to select a multi-level (for example, four-valued) voltage according to display data and supply it between two electrodes between which the liquid crystal element is interposed. Even in the electronic type printing device etc. of, for example, ink jet type printing devices etc., it is necessary to effect a D-A conversion of a character signal from a character signal generating circuit and sequentially provide a different voltage signal to a deflection electrode according to the character signal.

Such a conventional voltage selection circuit is constituted, for example, as shown in FIG. 1. FIG. 1 shows a circuit arrangement in which eight kinds of voltages $V_0$ to $V_7$ are selected. In the circuit arrangement shown in FIG. 1 a decoder 1 consists of, for example, inverters 2a to 2c and NAND circuits 3a to 3h. A code signal ($A_0$, $A_1$, $A_2$) for voltage selection is applied to the input terminal of the decoder 1. The decoder 1 decodes the binary coded signal and generates an output signal which is applied to any one of the NAND circuits 3a to 3h. The outputs of the NAND circuits 3a to 3d are coupled directly to the P-channel MOS transistors 4a to 4d and the outputs of the NAND circuits 3e to 3h are coupled to the N-channel MOS transistors 4e to 4h through inverters 5a to 5d. Voltages $V_0$ to $V_7$ of different level are simultaneously supplied to the source electrodes of the transistors 4a to 4h and the drain electrodes of the transistors 4a to 4h are connected to an output terminal 6.

When in the circuit arrangement shown in FIG. 1 the code signal ($A_1$, $A_2$, $A_3$) is applied, a signal is generated from one of the NAND circuits 3a to 3h in the decoder 1, causing a corresponding one of the MOS transistors 4a to 4h to be turned ON. By so doing a voltage being applied to the source electrode of its MOS transistor appears at the output terminal 6. In this way, a different level of voltages $V_0$ to $V_7$ is selected according to the code signal ($A_1$, $A_2$, $A_3$) and a corresponding output emerges from the output terminal 6.

In such conventional voltage selection circuit it is necessary to provide a decoder and a gate circuit adapted to be operated by the decoder. Furthermore, a large number of circuit elements are involved, resulting in a complicated circuit arrangement. Since C-MOS transistors (complementary MOS transistors) are used for the gate circuits and C-MOS transistors are not used for the other circuits, a greater amount of electric power is involved.

SUMMARY OF THE INVENTION

Accordingly, the object of this invention is to provide a voltage selection circuit, free from the above-mentioned drawbacks, which is capable of reducing the number of circuit elements and simplifying a circuit arrangement and which is capable of lowering power consumption.

According to this invention a conventionally employed decoder can be omitted. The voltage selection circuit according to this invention includes at least one group of series-connected P-channel MOS transistors and at least one group of series-connected N-channel MOS transistors, both the groups constituting a C-MOS circuit. Any one voltage can be selected, in response to the values of binary coded signals applied to the gates of the MOS transistors in the respective series-connected transistor groups, from voltages of different level which are applied to the open source electrodes of the MOS transistor in the respective series-connected transistor groups. The selected voltage can be taken out from an output terminal i.e. a junction between the open drain electrodes of the series-connected transistor groups. Since according to this invention a decoder circuit is not required for taking out selected voltages and only gate circuits are used instead, it is possible to reduce the number of circuit elements required for voltages to be selected. This simplifies the circuit arrangement and power consumption can be saved, for a complementary circuit can be used as each gate circuit.

DETAILED DESCRIPTION OF THE PREFERRED EMBODIMENTS

The embodiments of this invention will be explained below by referring to FIGS. 2 and 3.

Figure 1:
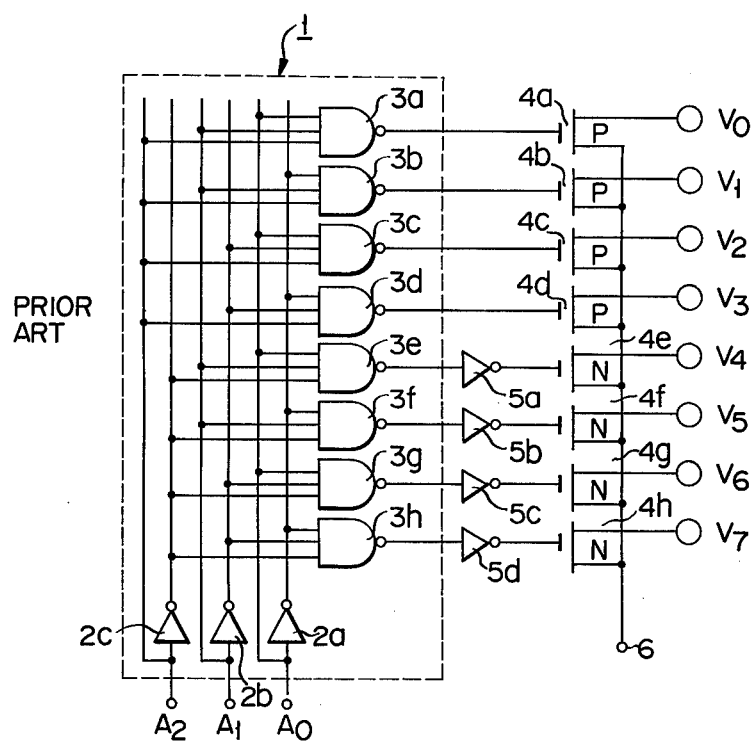
FIG. 1 is a circuit arrangement showing one embodiment of a conventional voltage selection circuit.
Figure 2:
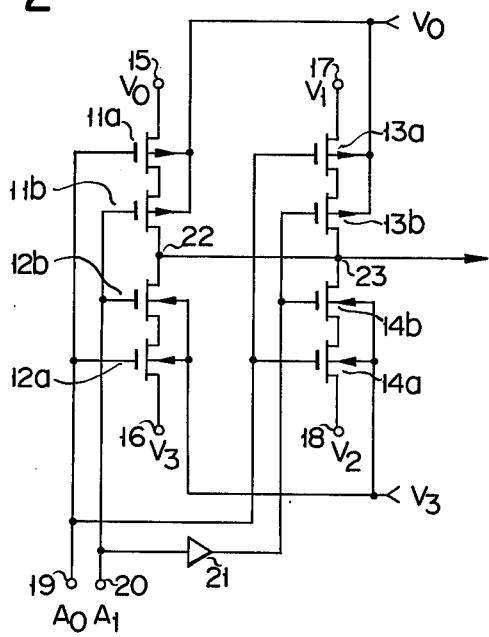
FIG. 2 is a circuit arrangement according to one embodiment of this invention which is capable of selecting four different kinds of voltages.

As shown in FIG. 2 a source electrode of a P-channel MOS transistor 11b is connected to a drain electrode of a P-channel MOS transistor 11a to provide a series-connected P-channel transistor group. A drain electrode of an N-channel MOS transistor 12a is connected to a source electrode of an N-channel MOS transistor 12b to provide a series-connected N-channel transistor group. The open drain electrodes of both the P- and N-channel transistor groups are connected to each other to provide a first C-MOS type circuit. Likewise, a source electrode of a P-channel MOS transistor 13b is connected to a drain electrode of a P-channel MOS transistor 13a to provide a series-connected P-channel transistor group and a drain electrode of an N-channel MOS transistor 14a is connected to a source electrode of an N-channel MOS transistor 14b to provide a series-connected N-channel transistor group. The open drain electrode of both the P- and N-channel transistor groups are connected to each other to provide a second C-MOS type circuit. Voltages $V_0$ and $V_3$ to be selected are applied to terminals 15 and 16, respectively, so that they can be applied to the open source electrodes in the first C-MOS type circuit and voltages $V_1$ and $V_2$ to be selected are applied to terminals 17 and 18, respectively, so that they can be applied to the open source electrodes in the second C-MOS type circuit. The voltage $V_0$ represents a logic high level and the voltage $V_3$ represents a logic low level. The levels of the voltages are determined in the decreasing order of $V_0 \rightarrow V_1 \rightarrow$ $V_2 \to V_3$. A binary coded signal $A_0$ on a terminal 19 is applied, as a gate control signal, to the gate electrodes of the P-channel MOS transistor 11a and N-channel MOS transistor 12a in the first C-MOS type circuit and a binary coded signal $A_1$ on a terminal 20 is supplied to the gate electrodes of the P-channel MOS transistor 11b and N-channel MOS transistor 12b. A binary coded signal $A_0$ is applied to the gate electrodes of the P-channel MOS transistor 13a and N-channel MOS transistor 14a in the second C-MOS type circuit and a binary coded signal $A_1$ is applied through an inverter 21 to the gate electrodes of the P-channel MOS transistor 13b and N-channel MOS transistor 14b. The voltage $V_0$ equivalent to a logic high level is applied to the substrate electrodes of the P-channel MOS transistors 11a, 11b and 13a and 13b, while the voltage $V_3$ representing a logic low level is supplied to the substrate electrodes of the N-channel MOS transistors 12a, 12b and 14a, 14b. A junction between the open drain electrodes of the P-channel MOS transistor group and N-channel MOS transistor group in the first C-MOS type circuit constitutes an output terminal 22 from which a voltage to be selected is taken out, while a junction between the open drain electrodes of the P-channel MOS transistor group and N-channel MOS transistor group in the second C-MOS type circuit constitutes an output terminal 23 from which a voltage to be selected is taken out.

In the circuit arrangement so constructed, the binary coded signals $A_0$ and $A_1$ to be applied to the terminals 19 and 20, respectively, have potential levels such that when a 0 signal (low level) is applied the P-channel transistor is turned ON and when a 1 signal (high level) is applied the N-channel transistor is turned ON. When the binary coded signals $A_0$ and $A_1$ are both in the 0 state, the P-channel MOS transistors 11a and 11b which are associated with the voltage $V_0$ are both turned ON and at least one of a pair of MOS transistors in the respective MOS transistor groups which are associated with the voltages $V_1$ to $V_3$ is turned OFF. As a result, the voltage $V_0$ appears at the output terminal 22 through the P-channel MOS transistors 11a and 11b. When the control signal $A_0$ is in the 1 state and the control signal $A_1$ is in the 0 state, the P-channel MOS transistors 13a and 13b associated with the voltage $V_1$ are turned ON and at least one of a pair of MOS transistors in the respective MOS transistor groups which are associated with the voltages $V_0$, $V_2$ and $V_3$ are turned OFF. As a result, the voltage $V_1$ appears at the output terminal 23. Likewise, when the control signal $A_0$ is in the 0 state and the control signal $A_1$ is in the 1 state, the voltage $V_2$ appears at the output terminal 23 and when the control signals $A_0$ and $A_1$ are both in the 1 state, the voltage $V_3$ appears at the output terminal 22. Table 1 shows a relation between the control signals $A_0$, $A_1$ and the voltages $V_0$ to $V_3$.

Table 1

| $A_1$ | $A_0$ | Output |
|---|---|---|
| 0 | 0 | $V_0$ |
| 0 | 1 | $V_1$ |
| 1 | 0 | $V_2$ |
| 1 | 1 | $V_3$ |

Figure 3:
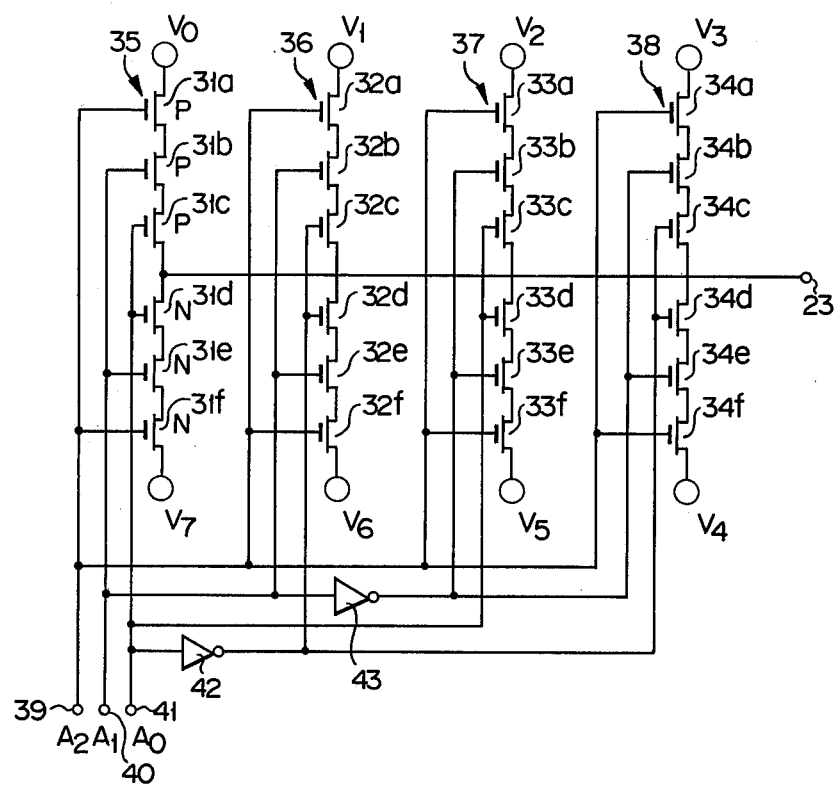
FIG. 3 is a circuit arrangement according to another embodiment of this invention which is capable of selecting eight different kinds of voltages.

FIG. 3 shows another embodiment in which eight kinds of voltages $V_0$ to $V_7$ of different level can be obtained.

In FIG. 3 embodiment a first C-MOS circuit 35 comprises a P-channel transistor group consisting of three P-channel MOS transistors 31a to 31c and an N-channel transistor group consisting of three N-channel MOS transistors 31d to 31f; a second C-MOS circuit 36 comprises a P-channel transistor group consisting of three P-channel MOS transistors 32a to 32c and an N-channel transistor group consisting of three N-channel MOS transistors; a third C-MOS circuit 37 comprises a P-channel transistor group consisting of three P-channel MOS transistor 33a to 33c and an N-channel transistor group consisting of three N-channel MOS transistors 33d to 33f; and a fourth C-MOS circuit 38 comprises a P-channel transistor group consisting of three P-channel MOS transistors 34a to 34c and an N-channel transistor group consisting of three N-channel MOS transistors 34d to 34f. A junction between the open drain electrodes of the P-channel transistor group and N-channel transistor group in the respective C-MOS circuits leads to an output terminal 23. The number of P- or N-channel MOS transistors is determined according to the number of bits of a control signal to be applied to the gate electrode. If the number of bits is represented by $n$ with the number of to-be-selected voltages represented by N, the following relation is established:

$$2^n = N$$

If eight kinds of voltages are selected, $n = 3$. Voltages $V_0$–$V_7$ to be selected are supplied to the open source electrodes of the P- and N-channel transistor groups in the respective C-MOS circuits 35, 36, 37 and 38. The gate electrodes of paired P- and N-channel MOS transistors in the C-MOS circuit which are symmetrically disposed with the junction of the P- and N-channel transistor groups as a center are connected in common. The gate electrodes of the paired P- and N-channel MOS transistors in the first C-MOS circuit are connected in common to the gate electrodes of the corresponding paired P- and N-channel MOS transistors in the remaining C-MOS circuits as shown in FIG. 3, and the gate electrodes of the paired P- and N-channel MOS transistors in the C-MOS circuit are connected directly, or through an inverter 42, 43 to terminals 39, 40, 41 to which a control signal is applied.

When in the circuit arrangement shown in FIG. 3 gate control signals (binary coded signals) $A_0$, $A_1$ and $A_2$ are all in the 0 state, the P-channel MOS transistors 31a to 31c associated with a voltage $V_0$ to be selected are all turned ON and at least one of the MOS transistors in each of the remaining transistor groups associated with voltages $V_1$ to $V_7$ to be selected is turned OFF. As a result, the voltage $V_0$ appears at the output terminal 23 through the transistors 31a to 31c. When the gate control signal $A_0$ is in the 1 state and the gate control signals $A_1$ and $A_2$ are both in the 0 state the P-channel MOS transistors 32a to 32c associated with the voltage $V_1$ are turned ON and at least one of the MOS transistors in each of the remaining transistor groups associated with the voltages $V_0$ and $V_2$ to $V_7$ is turned OFF. As a result, the voltage $V_1$ appears at the output terminal 23 through the P-channel MOS transistors 32a to 32c. In this way, any one of the voltages $V_0$ to $V_7$ is selected in accordance with the states of the control signals $A_0$, $A_1$ and $A_2$. Table 2 shows a relation between the control voltages $A_0$, $A_1$ and $A_2$ and the voltages $V_0$ to $V_7$.

Table 2

| $A_2$ | $A_1$ | $A_0$ | Output |
|---|---|---|---|
| 0 | 0 | 0 | $V_0$ |

Table 2-continued

| | | | |
|---|---|---|---|
| 0 | 0 | 1 | $V_1$ |
| 0 | 1 | 0 | $V_2$ |
| 0 | 1 | 1 | $V_3$ |
| 1 | 0 | 0 | $V_4$ |
| 1 | 0 | 1 | $V_5$ |
| 1 | 1 | 0 | $V_6$ |
| 1 | 1 | 1 | $V_7$ |

Although in the above-mentioned embodiment the P- and N-channel transistor groups are arranged in a mutually opposed relation for each gate circuit, one channel transistor group can be omitted for any gate circuit. In so doing, any number of voltages can be selected without restricting the number of to-be-selected voltages to $2^n$.

The to-be-selected voltage shown in the above-mentioned embodiment includes a ground level. Although the above-mentioned embodiment employs the same number of P- and N-channel transistor groups, if the number of to-be-selected voltages is not $2^n$, the P- and N-channel transistor groups may differ in number from each other.

What is claimed is:

1. A multi-level voltage selection circuit comprising: two CMOS circuits, each including a pair of P-channel MOS transistors serially connected in source-to-drain fashion, and a pair of N-channel MOS transistors serially connected in source-to-drain fashion and having their gate electrodes connected to those of said P-channel MOS transistors, respectively, thereby forming two pairs of P- and N-channel MOS transistors, and the open drain electrode of said pair of N-channel MOS transistors being connected to that of said pair of P-channel MOS transistors;

an output terminal connected to the junctions between the P-channel MOS transistors and N-channel MOS transistors of said two CMOS circuits;

two gate control terminals, one of said gate control terminals being connected to the gate electrodes of one pair of P- and N-channel MOS transistors of one of said CMOS circuits and to those of one pair of P- and N-channel MOS transistors of the other CMOS circuit, and the other of said gate control terminals being connected to the gate electrodes of the other pair of P- and N-channel MOS transistors of one of said CMOS circuits and to those of the other pair of P- and N-channel MOS transistors of the other CMOS circuit, said gate control terminals receiving 1-bit binary coded signals;

a logic circuit including one inverter and connected between said gate control terminals and the gate electrodes of said P- and N-channel MOS transistors so as to supply said 1-bit binary coded signals to the gate electrodes of both pairs of P- and N-channel MOS transistors of one of said CMOS circuits and the gate electrodes of one pair of P- and N-channel MOS transistors of the other CMOS circuit and said 1-bit binary coded signals inverted by said inverter to the gate electrodes of the other pair of P- and N-channel transistors of the other CMOS circuit; and four selection voltage supplying terminals connected to the open source electrodes of said CMOS circuits, respectively.

2. A multi-level voltage selection circuit comprising:

at least two CMOS circuits, each including (i) a group of P-channel MOS transistors serially connected in source-to-drain fashion, each group thus having an open drain electrode and an open source electrode, and (ii) a group of N-channel MOS transistors in the same number as said P-channel MOS transistors, serially connected in source-to-drain fashion so as to have an open drain electrode and an open source electrode, the open drain electrode of said N-channel MOS transistor group being connected to that of said P-channel MOS transistor group, the gate electrode of each P-channel MOS transistor being connected to that of a corresponding N-channel MOS transistor, thus forming a pair of P- and N-channel MOS transistors;

an output terminal connected to the junctions between the P- and N-channel MOS transistor groups in said CMOS circuits;

at least two gate control terminals, each gate control terminal supplying binary coded signals to the gate electrodes of the MOS transistors of each CMOS circuit;

a logic circuit connected between said gate control terminals and the gate electrodes of the MOS transistors of said CMOS circuits so as to supply the binary coded signals supplied to said gate control terminals to the gate electrodes of the MOS transistors of one of said CMOS circuits and binary coded signals complementary to those supplied to said gate control terminals to the gate electrodes of the MOS transistors of the other CMOS circuit; and at least four selection voltage supplying terminals connected to the open source electrodes of said CMOS circuits, respectively.

3. A multi-level voltage selection circuit according to claim 2, wherein said logic circuit comprises a number of inverters the number of which is expressed as "X − 1", where X denotes the number of said gate control terminals.

4. A multi-level voltage selection circuit according to claim 2, wherein the number of MOS transistors comprising each CMOS circuit is expressed as "$X^2 \cdot X$", where X denotes the number of said gate control terminals.

5. A multi-level voltage selection circuit according to claim 2, wherein the number of said selection voltage supplying terminals is expressed as "$2^x$"; said logic circuit comprises a number of inverters the number of which is expressed as X − 1; and the number of MOS transistors comprising each CMOS circuit is expressed as $2^x \cdot X$, where X denotes the number of said gate control terminals; said logic circuit supplying the binary coded signals supplied to the gate control terminals to the MOS transistors of one of said CMOS circuits and binary coded signals complementary to those supplied to said gated control terminals to the MOS transistors of the other CMOS circuit.

* * * * *